(12) United States Patent
Baumgartner et al.

(10) Patent No.: US 8,181,131 B2
(45) Date of Patent: May 15, 2012

(54) ENHANCED ANALYSIS OF ARRAY-BASED NETLISTS VIA REPARAMETERIZATION

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 12/771,613

(22) Filed: Apr. 30, 2010

(65) Prior Publication Data

US 2011/0271244 A1    Nov. 3, 2011

(51) Int. Cl.
*G06F 9/455* (2006.01)
*G06F 17/50* (2006.01)
*G06F 9/45* (2006.01)

(52) U.S. Cl. .................. 716/103; 716/106; 716/111

(58) Field of Classification Search .................. 716/103, 716/106, 111
See application file for complete search history.

(56) References Cited

U.S. PATENT DOCUMENTS

| | | | |
|---|---|---|---|
| 5,255,239 A | 10/1993 | Taborn et al. | |
| 5,377,123 A | 12/1994 | Hyman | |
| 5,644,498 A | 7/1997 | Joly et al. | |
| 5,708,612 A | 1/1998 | Abe | |
| 5,748,527 A | 5/1998 | Lee et al. | |
| 5,818,726 A | 10/1998 | Lee | |
| 5,918,035 A | 6/1999 | Van Praet et al. | |
| 5,953,283 A | 9/1999 | Meltzer et al. | |
| 6,374,205 B1 | 4/2002 | Kuribayashi et al. | |
| 6,374,390 B1 | 4/2002 | Quarles et al. | |
| 6,378,112 B1 | 4/2002 | Martin et al. | |
| 6,425,116 B1 | 7/2002 | Duboc et al. | |
| 6,449,747 B2 | 9/2002 | Wuytack et al. | |
| 6,532,440 B1 | 3/2003 | Boppana et al. | |
| 6,611,952 B1 | 8/2003 | Prakash et al. | |
| 6,636,939 B1 | 10/2003 | George | |
| 6,654,849 B1 | 11/2003 | Brockmann et al. | |
| 6,698,003 B2 | 2/2004 | Baumgartner et al. | |
| 6,717,884 B2 | 4/2004 | Kim | |
| 6,748,573 B2 | 6/2004 | Baumgartner et al. | |

(Continued)

FOREIGN PATENT DOCUMENTS

EP    1770495 A1    4/2007

(Continued)

OTHER PUBLICATIONS

USPTO U.S. Appl. No. 12/771,404.

(Continued)

*Primary Examiner* — Suresh Memula
(74) *Attorney, Agent, or Firm* — Stephen R. Tkacs; Stephen J. Walder, Jr.; Diana R. Gerhardt

(57) ABSTRACT

A mechanism is provided for increasing the scalability of formal verification solutions through enabling the use of input reparameterization on logic models that include memory arrays. A pre-processing mechanism enables the selection of a cut-based design partition which enables optimal reductions though input reparameterization given a netlist with constraints. A post-processing mechanism next prevents input reparameterization from creating topologically inconsistent models in the presence of arrays. Additionally, this technique may be used to rectify inconsistent topologies that may arise when reparameterizing even netlists without arrays, namely false sequential dependencies across initialization constructs. Furthermore, a mechanism is provided to undo the effects of memory array based input reparameterization on verification results.

20 Claims, 6 Drawing Sheets

U.S. PATENT DOCUMENTS

| | | |
|---|---|---|
| 6,763,505 B2 | 7/2004 | Baumgartner et al. |
| 6,847,927 B2 | 1/2005 | Hoffman et al. |
| 7,006,370 B1 | 2/2006 | Ramesh et al. |
| 7,069,523 B2 | 6/2006 | Nation et al. |
| 7,194,724 B2 | 3/2007 | Hattori et al. |
| 7,260,799 B2 | 8/2007 | Baumgartner et al. |
| 7,290,228 B2 | 10/2007 | Guenther et al. |
| 7,299,432 B2 | 11/2007 | Baumgartner et al. |
| 7,367,002 B2 | 4/2008 | Baumgartner et al. |
| 7,386,818 B2 | 6/2008 | Ganai et al. |
| 7,398,484 B2 | 7/2008 | Ruf |
| 7,448,005 B2 * | 11/2008 | Baumgartner et al. ....... 716/106 |
| 7,506,297 B2 | 3/2009 | Mukherjee et al. |
| 7,512,925 B2 | 3/2009 | Birmiwal et al. |
| 7,523,380 B1 | 4/2009 | Trimberger |
| 7,934,180 B2 | 4/2011 | Baumgartner et al. |
| 7,962,880 B2 | 6/2011 | Lipetz et al. |
| 8,001,498 B2 * | 8/2011 | Bjesse ........................... 716/103 |
| 2001/0052106 A1 | 12/2001 | Wuytack et al. |
| 2003/0065965 A1 | 4/2003 | Korobkov |
| 2003/0123319 A1 | 7/2003 | Kim |
| 2004/0039893 A1 | 2/2004 | Lyon |
| 2004/0117744 A1 | 6/2004 | Nation et al. |
| 2005/0091475 A1 | 4/2005 | Sodani |
| 2006/0136849 A1 | 6/2006 | Greenberg et al. |
| 2007/0067746 A1 * | 3/2007 | Baumgartner et al. ........... 716/5 |
| 2007/0121499 A1 | 5/2007 | Pal et al. |
| 2008/0066034 A1 * | 3/2008 | Baumgartner et al. ........... 716/5 |
| 2008/0120085 A1 | 5/2008 | Alexanian et al. |
| 2008/0134114 A1 | 6/2008 | Bjesse et al. |
| 2008/0144421 A1 | 6/2008 | Deng et al. |
| 2009/0013301 A1 | 1/2009 | Ogilvie et al. |
| 2009/0119428 A1 | 5/2009 | Chow et al. |
| 2009/0144674 A1 | 6/2009 | Koithyar et al. |
| 2009/0190386 A1 | 7/2009 | Kim |
| 2009/0228848 A1 | 9/2009 | Kumazaki |
| 2010/0020605 A1 | 1/2010 | Aritome |
| 2010/0097837 A1 | 4/2010 | Paul |
| 2010/0107132 A1 * | 4/2010 | Bjesse ............................... 716/5 |
| 2010/0293513 A1 * | 11/2010 | Baumgartner et al. ........... 716/3 |
| 2011/0066578 A1 | 3/2011 | Chong et al. |
| 2011/0145780 A1 | 6/2011 | Chen |
| 2011/0270597 A1 | 11/2011 | Baumgartner et al. |
| 2011/0271242 A1 | 11/2011 | Baumgartner et al. |
| 2011/0271243 A1 | 11/2011 | Baumgartner et al. |
| 2011/0276930 A1 | 11/2011 | Baumgartner et al. |
| 2011/0276931 A1 | 11/2011 | Baumgartner et al. |
| 2011/0276932 A1 | 11/2011 | Baumgartner et al. |

FOREIGN PATENT DOCUMENTS

| | | |
|---|---|---|
| JP | 06162139 A2 | 6/1994 |
| JP | 09035497 A | 2/1997 |
| JP | 2008541331 | 11/2008 |

OTHER PUBLICATIONS

USPTO U.S. Appl. No. 12/771,479.
USPTO U.S. Appl. No. 12/771,677.
USPTO U.S. Appl. No. 12/775,607.
USPTO U.S. Appl. No. 12/775,622.
USPTO U.S. Appl. No. 12/775,633.
Bardell, PH et al., "Random Pattern Testability of the Logic Surrounding Memory Arrays", IBM technical Disclosure Bulletin, IPCOM000039582D, Jul. 1987, pp. 521-528.
Baumgartner, J et al., "Maximal Input Reduction of Sequential Netlists via Synergistic Reparameterization and Localization Strategies", Correct Hardware Design and Verification Methods, 13th IFIP WG 10.5 Advanced Research Working Conference, CHARME 2005, Proceedings 3-6, Saarbrucken, Germany, Oct. 2005, 1 page.
Burch, Jerry R. et al., "Automatic Verification of Pipelined Microprocessor Control", Lecture Notes in Computer Science, vol. 818, Proceedings of the 6th International Conference on Computer Aided Verification, Year of Publication: 1994, pp. 68-80.
Pandey, M et al., "Formal Verification of Memory Arrays Using Symbolic Trajectory Evaluation", IEEE International Workshop on Memory Technology, Design and Testing (MTDT 1997), pp. 42.
Ray, Sandip et al., "Abstracting and Verifying Flash Memories", http://userweb.cs.utexas.edu/~sandip/publications/flash-nvm-08/flash.pdf, <retrieved on Mar. 10, 2010>, 5 pages.
Velev, Miroslav et al., "Efficient Modeling of Memory Arrays in Symbolic Simulation", Computer Aided Verification, vol. 1254/1997, Jun. 1997, pp. 388-399.
Notice of Allowance mailed Nov. 29, 2011 for U.S. Appl. No. 12/771,677; 11 pp.
Office Action mailed Oct. 24, 2011 for U.S. Appl. No. 12/775,633; 15 pp.
Office Action mailed Dec. 9, 2011 for U.S. Appl. No. 12/775,622; 11 pp.
Notice of Allowance mailed Feb. 28, 2012 for U.S. Appl. No. 12/775,633; 7 pages.
Notice of Allowance mailed Mar. 26, 2012 for U.S. Appl. No. 12/775,622; 12 pages.
Office Action mailed Jan. 23, 2012 for U.S. Appl. No. 12/771,404; 9 pages.
Office Action mailed Mar. 8, 2012 for U.S. Appl. No. 12/775,607; 18 pages.
Response to Office Action filed with the USPTO on Jan. 24, 2012 for U.S. Appl. No. 12/775,633, 11 pages.
Response to Office Action filed with the USPTO on Mar. 9, 2012 for U.S. Appl. No. 12/775,622, 15 pages.

* cited by examiner

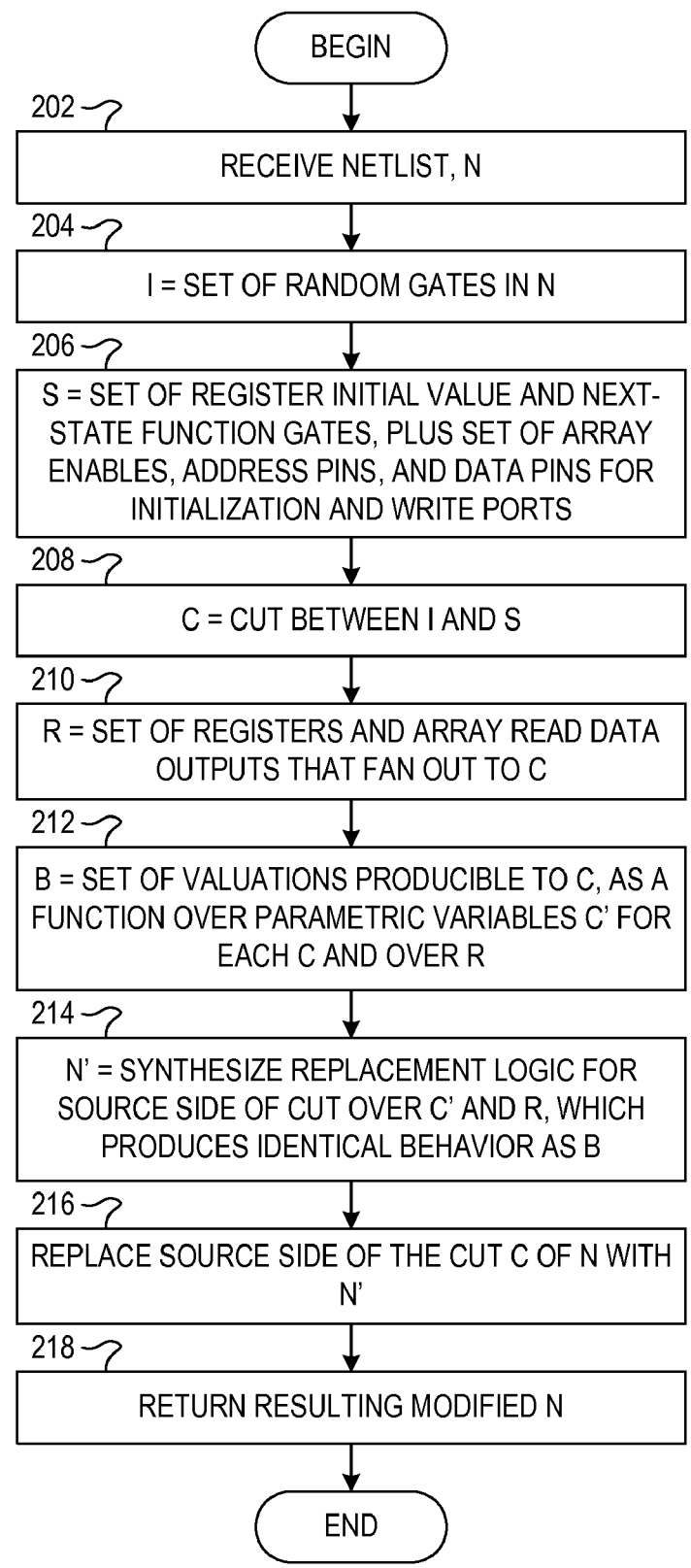

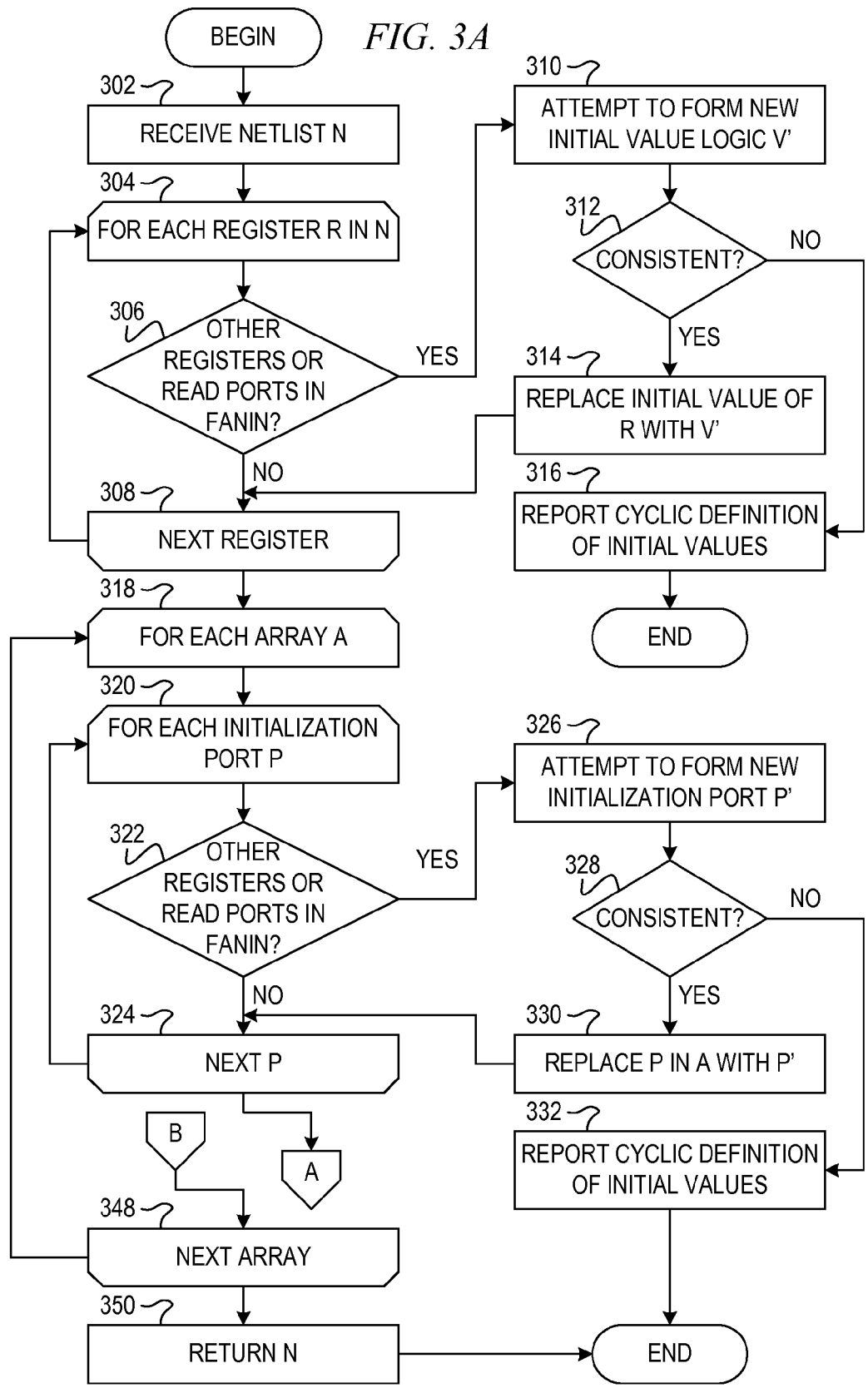

ENHANCED ANALYSIS OF ARRAY-BASED NETLISTS VIA REPARAMETERIZATION

BACKGROUND

The present application relates generally to an improved data processing apparatus and method and more specifically to mechanisms for enhanced analysis of array-based netlists via input reparameterization.

Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists. Unfortunately, formal verification techniques require computational resources that are exponential with respect to the size of the design under test. Semiformal verification techniques leverage formal algorithms to larger designs by applying them only in a resource-bounded manner, though at the expense of incomplete verification coverage.

U.S. Pat. No. 6,698,003 proposes the generic concept of "transformation-based verification" to enable the use of multiple algorithms, encapsulated as "engines" of a modular multiple-engine based verification system to synergistically simplify and decompose complex problems into simpler sub-problems that are easier to formally discharge. The transformation-based verification paradigm has demonstrated itself essential to enhance the scalability of formal verification algorithms to verification problems of industrial relevance, where it is often desired to leverage the bug-hunting power of formal methods to large units of logic that are the common focus of simulation-based test benches.

One large capacity gap between traditional formal verification algorithms and simulation-based testbenches is due to bit-blasting employed in the former. In particular, virtually every industrial hardware formal verification tool "bit-blasts" design components into simpler primitives, such as two-input AND gates, inverters, and single-bit state elements. In contrast, logic simulators often support higher-level primitives without bit-blasting. One type of design component that often entails a dramatic bloat when bit-blasted is a memory array, which is a row-addressable, two-dimensional state element often used to represent main memory or caches. Such memory arrays may be extremely large when bit-blasted. Modern caches often are several megabytes, and if verifying a design component that interacts with main memory, it may even be required to support more than $2^{32}$ rows of arbitrary width. Bit-blasting of such large memory arrays often constitutes a fatal bottleneck to formal verification tools.

The technique of input reparameterization is a way to simplify the design under test while preserving its behavior. This technique computes the set of values producible at a cut of the design under test as a function of its state elements, then re-encodes the cut by creating a piece of logic that produces exactly the same set of values as a function of its state elements. Because it has the freedom to create a completely new, yet behaviorally identical (with respect to the cut gates) piece of logic, this technique often offers a substantial reduction opportunity and thereby dramatic verification benefits.

SUMMARY

In one illustrative embodiment, a method, in a data processing system, is provided for performing input reparameterization on an integrated circuit design with a memory array. The method comprises receiving, by the data processing system, an original netlist for an integrated circuit design. The netlist comprises a memory array. The method further comprises validating, by the data processing system, that there are no semantic inconsistencies in the original netlist. The method further comprises performing, by the data processing system, input reparameterization on the original netlist to form a reparameterized netlist, and performing, by the data processing system, false combinational dependency rectification on the reparameterized netlist to form a rectified netlist. The method further comprises outputting, by the data processing system, the rectified netlist.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 2 is a flowchart illustrating operation of a mechanism for input reparameterization for netlists with arrays in accordance with an illustrative embodiment;

FIGS. 3A and 3B are flowcharts illustrating operation of a mechanism for false combinational dependency rectification for input reparameterization in accordance with an illustrative embodiment;

DETAILED DESCRIPTION

The illustrative embodiments provide a mechanism for increasing the scalability of formal verification solutions through enabling the use of input reparameterization on logic models that include memory arrays. A post-processing mechanism prevents input reparameterization from creating topologically inconsistent models in the presence of arrays. Additionally, this technique may be used to rectify inconsistent topologies that may arise when reparameterizing even netlists without arrays, namely false sequential dependencies across initialization constructs. Furthermore, the illustrative embodiments provide a mechanism to undo the effects of memory array based input reparameterization on verification results.

Figure 1:
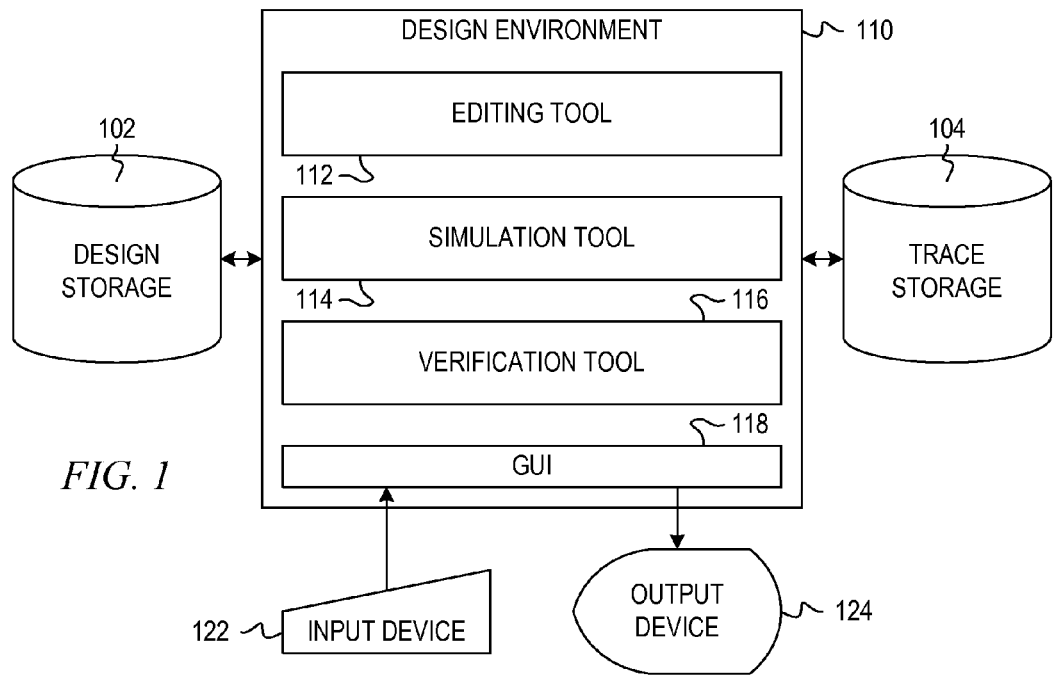
FIG. 1 is a block diagram illustrating an example design environment in accordance with an illustrative embodiment.

FIG. 1 is a block diagram illustrating an example design environment in accordance with an illustrative embodiment. When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototype control and decision structures in flowchart applications or enter them in a state-diagram editor. The process of writing the HDL description is highly dependent on the nature of the circuit and the designer's preference for coding style.

Design environment 110 may include editing tool 112, simulation tool 114, verification tool 116, and graphical user interface (GUI) 118. A circuit designer may create and edit an integrated circuit (IC) design, which may be written in a high-level HDL, such as VHSIC or Verilog, and store the IC design in design storage 102. The circuit designer may interact with editing tool 112 via graphical user interface (GUI) 118 using input device 122 and output device 124.

Simulation tool 114 simulates operation of an IC circuit from design storage 102. The designer may control simulation tool 114 via GUI 118 using input device 122 and output device 124. Simulation tool 114 stores trace results in trace storage 104. Simulation tool 114 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 114 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 110.

Verification tool 116 allows the designer to verify an IC design from design storage 102. A manufacturer may establish and maintain procedures for verifying an IC design. Design verification confirms that the design output meets the design input requirements. Verification tool 116 compares design outputs to design input requirements to determine whether the requirements have been met. The designer may control verification tool 116 via GUI 118 using input device 122 and output device 124. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

A netlist contains a directed graph with vertices representing gates and edges representing interconnections between those gates. The gates have associated functions, such as constants, primary inputs (hereafter referred to as RANDOM gates), combinational logic such as AND gates, simple sequential elements (hereafter referred to as registers), and memory arrays. Registers have two associated components: their next-state functions and their initial-value functions. The netlist represents both components as other gates in the graph. Semantically, for a given register, the value appearing at its initial-value gate at time "0" ("initialization" or "reset" time) is applied as the value of the register itself; the value appearing at its next-state function at time "i" is applied to the register itself at time "i+1".

To enable consistent semantics, the netlist must be free of combinational cycles: directed cycles in the netlist graph that contain no registers. Additionally, the initialization logic (e.g., initialization values) must contain no registers in their definition to avoid inconsistent definitions, e.g., that the initial value of register R1 is register R2 and vice versa. A cut of a netlist graph refers to a partition of the graph into two components: the "source side" and the "sink side." Gates that source edges crossing from the source to sink side are referred to as "cut gates."

Memory arrays represent two-dimensional grids of registers, arranged as rows vs. columns. A circuit reads or writes the contents of memory arrays via dedicated "ports" of three types: read ports, initialization ports, and write ports. Ports of these three types have three components: an address, a data vector, and an enable. The address indicates which row is to be accessed. The enable indicates whether or not the given port is being accessed. The data vector indicates what value is to be written to the given row (if enabled) in the case of a write port or the contents present for the given row of an enabled read. Initialization ports are specialized write ports that are relevant only at time 0.

Memory arrays have a pre-defined number of rows and columns, a default initial value (in case of an unwritten row is read), and an indication of read-before-write vs. write-before read behavior. The latter is relevant in case of a concurrent read and write to the same address: read-before-write will not return the concurrent write data, whereas write-before-read will. The memory array will often conservatively randomize data contents of a read port in case the read enable is not active, or in case the read row is "out-of-bounds," i.e. the read address is larger than the pre-defined number of rows for the array. Write ports and initialization ports have a pre-defined precedence defining which values will persist in case of multiple concurrent writes or initializations to the same address. Port precedence is irrelevant for read ports; every concurrent read to a given address returns the same data, which is the highest-priority write to the given address in the case of write-before-read, else the highest-priority most recent write to that address if any exist, else the highest-priority initialization to that address if any such initialization ports exist, else the default initial value.

Certain gates in a netlist are labeled as "targets." Targets correlate to the properties one wishes to verify; the goal of the verification process is to find a way to drive a "1" to a target node (and to generate a "trace" illustrating this scenario if one is found), or to prove that no such assertion of the target is possible.

To ensure consistent semantics, there are several topological requirements regarding a netlist with arrays. First, similar to the requirements that traditional bit-blasted netlists have no combinational cycles, there is a requirement that no read port's enable or address be combinationally dependent upon the data output for the corresponding read port. Second, for write-before-read arrays, there is a requirement that no write enable, address, or data pin be combinationally dependent upon any read port data output from that array.

The technique of input reparameterization attempts to render netlist size reductions as follows. Given a combinationally-driven cut of the design under test (i.e. the "source side of the cut contains no state elements), the mechanism of the illustrative embodiments computes the set of values that are producible at those cut gates. The mechanism then creates a new piece of logic that produces exactly the same behavior as the "source" side of the cut and replaces the cut gates with this new logic. Note that one cannot merely inject cutpoints (RANDOM gates) to the cut gates, as that would generally constitute an overapproximate transformation, because these cutponits could exhibit the exact behavior of the original cut, in addition to possibly more behavior, whereas the purpose of this transformation in the illustrative embodiments is to render a property-preserving transformation.

More specifically, a set of N cutpoints can produce any possible stream of $2^N$ values over time, whereas the behavior of the original cut gates may be constrained to only produce a subset of the possible $2^N$ values. The goal of this reduction is to create a simpler yet functionally equivalent piece of replacement logic, reducing the overall size of the design under verification. Note also that this approach is primarily geared toward reducing combinational logic and RANDOM gates, because it directly reuses the state variables when re-encoding over sequential cuts.

When the cut gates are only combinationally driven as discussed, those gates exhibit behavior that is not sequentially constrained. For example, the set of values that are producible to these gates at time "i" are not dependent upon values taken at time "j !=i". More generally, one may extend this re-encoding approach to cover sequential cuts by enumerating the set of values producible to the cut gates as a function of the state elements driving the cut gates, then creating a new piece of logic that produces exactly that set of values as a function of those state elements and replacing the cut gates with this new logic. Even in such a sequential application, note that one need only perform combinational analysis to discern the set of values producible to the cut gates as a function of state elements.

Traditional input reparameterization has been proposed solely to simplify bit-blasted netlists without higher level constructs such as memory arrays. The illustrative embodiments described herein propose an optimal extension to input reparametrization for netlists with arrays, where the optimality refers to a solution that ensures as few RANDOM gates as possible.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 2 is a flowchart illustrating operation of a mechanism for input reparameterization for netlists with arrays in accordance with an illustrative embodiment. Operation begins, and the mechanism receives a netlist, N (block 202). The mechanism sets I to the set of RANDOM gates in the initial netlist (block 204). Then, the mechanism sets S to the set of register initial values and next-state function gates, plus the set of array enables, address pins, and data pins for initialization and write ports (block 206). The mechanism then sets C to the cut between I and S (block 208).

Blocks 204-208 compute the portion of netlist N that is to be abstracted. The mechanism seeds this computation with the set of RANDOM gates I and the set of gates that define inputs to the state elements in the design S. The mechanism computes a cut between these two seeded sets.

To enable optimality of the transformed netlist, in an example embodiment, the mechanism computes a mini-cut that ensures that a minimal set of cut gates is defined. The mechanism sets R to the set of registers and array read data outputs that fan out to C (block 210). The mechanism sets B to the set of valuations producible to C, as a function over parametric variables C' for each C, and over R (block 212).

In accordance with an example embodiment, the mechanism may perform block 212 using a variety of techniques: e.g., exhaustive logic simulation enumerating the behavior of C over I and R, Boolean satisfiability techniques to symbolically perform a similar enumeration, or using Binary Decision Diagrams to first compute the function of each element of C over I and R (referred to as f_C(I, R)), then to create a parametric variable C' for each element of C, then to compute "exists(I, conjunct(C'==f_C(I, R)))" as the resulting B. In more detail, inside this computation, the mechanism may compute the conjunction (AND) over all C of "C'==f_C(I, R)" and then existentially quantify I from the resulting conjunction. Finally, the mechanism may use a straight-forward synthesis technique, such as standard multiplexor-based synthesis, to turn B into a logic structure N' that may be composed into N to simplify the netlist.

The mechanism then synthesizes replacement logic for the source side of cut over C' that produces identical behavior as B and sets the synthesized replacement logic to N' (block 214). Then, the mechanism replaces the source side of the cut C of N with N' (block 216). The mechanism then returns the resulting modified netlist N (block 218), and operation ends.

As mentioned above, in the netlist definition it is generally required to ensure consistent semantics and that there are no combinational dependencies between the enable and address pins of a given read port and the read data output for that port. Additionally, it is generally required that write-before-read arrays have no combinational dependencies between any read data output and write port pins. Note that there is no restriction in the operation of FIG. 2 that the cut C disallows R, including read data outputs, from fanning out to gates that may combinationally drive S, which includes read and write enable and address, and data for the latter. In accordance with an example embodiment, the mechanism places a restriction on C to avoid such a risk, e.g., by placing the fanout of read data outputs in I. However, doing so would significantly limit the flexibility of the input reparameterization technique to optimally reduce the network, thereby diminishing the utility of this technique. In accordance with an illustrative embodiment, a mechanism is provided for legalizing any undesired combinational feedback.

Furthermore, legal netlists cannot include any sequential logic in their initial value definitions. This means that no register or array read output may appear in the definition of the initial value of any register or initialization port of any array. It is possible that an undesired byproduct of input reparameterization is to create the appearance such a dependency, or the above mentioned undesired read port dependency, in a netlist that otherwise did not initially include such a dependency.

As an example of this phenomenon of creating a false dependency, consider a simple netlist where cut C from the operation of FIG. 2 includes the initial value of register R1, along with some other register R2 in C. Assume that the logic driving these cut gates is such that both must be a logical 1. Using a Binary Decision Diagram to represent this logic results in the function (C1 and R2). Depending on the order of variables within the Binary Decision Diagram, the synthesis of the logic for C1 in N' may be function "if(R2) then C1'," i.e. "NOT(R2) or C1'." Note in the original netlist that C1 must be logical 1 independent of the value of R2, though the Binary Decision Diagram synthesis created the false dependency between these two, thereby violating netlist consistency semantics.

Prior art input reparameterization techniques did not consider such a risk, and in practice prior art techniques handled such a risk by reverting the transformation if a sequential dependency would arise in the initialization logic. The illustrative embodiments described herein solves both of these classes of issues—the creation of sequential dependencies in initialization logic and the creation of combinational feedback between array ports—by providing a mechanism for rectifying false combinational dependency, which may be applied as a post-process operation to the operation of the mechanism described above with reference to FIG. 2. In practice, said extensions are critical to enable the verification benefits of input reparameterization without the risk of needing to revert said input reparameterization due to such false dependencies.

Figure 3B:
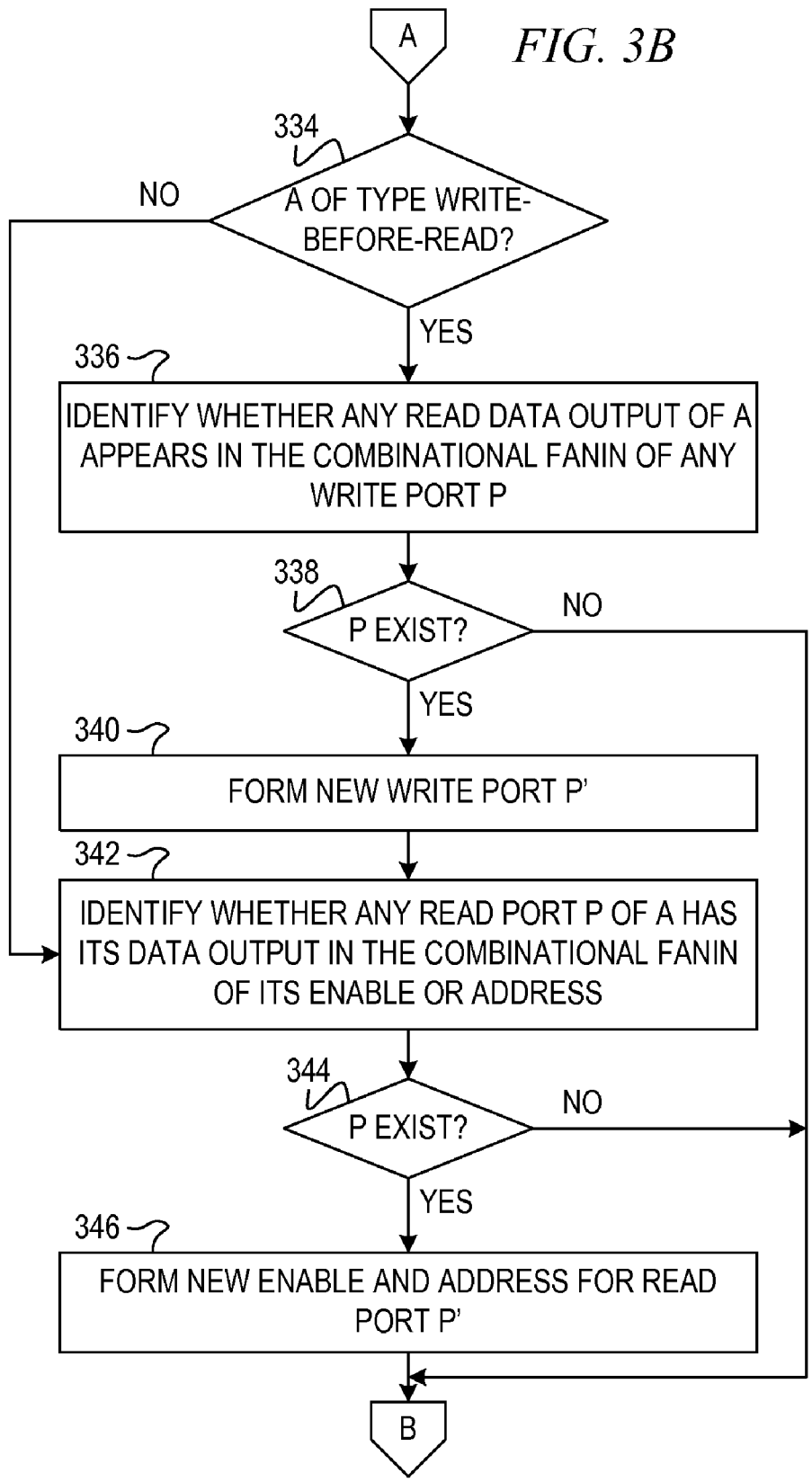

FIGS. 3A and 3B are flowcharts illustrating operation of a mechanism for false combinational dependency rectification for input reparameterization in accordance with an illustrative embodiment. With reference to FIG. 3A, operation begins, and the mechanism receives a netlist, N (block 302). For each register R in N (block 304), the mechanism determines whether the initial value function of R has any other registers or read output ports in its fanin (block 306). If the initial value function of R does not have any other registers or read output ports in its fanin, the mechanism considers the next register (block 308), and operation returns to block 304 to repeat the loop for the next register. If the initial value function of R has other registers or read output ports in its fanin in block 306, the mechanism attempts to form new initial value logic V' by cloning the original initial value cone, though embedding initial values in place of any sequential logic therein (block 310). Then, the mechanism determines whether the initial value logic V' is consistent (block 312). In this context, "consistent" refers to the ability to create such new initial value logic with no references to registers or read output ports. Cases of cyclic definitions, e.g., in the above-mentioned case where the initial value of register R1 is defined as R2 and vice versa, cannot be so rectified and the cloning process would abort with an indication of inconsistency. If V' is consistent, the mechanism replaces the initial value of R with V' (block 314) and proceeds to block 308 to consider the next register, and operation returns to block 304 to repeat the loop for the next register. If V' is not consistent in block 312, the mechanism reports the cyclic definition of the initial values (block 316), and operation ends.

If the mechanism has considered the last register in block 308, then for each array A (block 318) and for each initialization port P (block 320), the mechanism determines whether the initial value function of the port has any other registers or read output ports in its fanin (block 322). If the initial value function of the port does not have any other registers or read output ports in its fanin, the mechanism considers the next initialization port (block 324), and operation returns to block 320 to repeat the loop for the next initialization port P. If the initial value function of the port has other registers or read output ports in its fanin in block 322, the mechanism attempts to form a new initialization port P' by cloning the original logic driving this initialization port, though embedding initial values in place of any sequential logic therein (block 326). Then, the mechanism determines whether P' is consistent (block 328). If P' is consistent, the mechanism replaces P in A with P' (block 330), and mechanism proceeds to block 324 to consider the next initialization port, and operation returns to block 320 to repeat the loop for the next initialization port. If P' is not consistent in block 328, then the mechanism reports the cyclic definition of initial values (block 332), and operation ends.

If the mechanism has considered the last initialization port in block 324, operation proceeds to FIG. 3B, and the mechanism determines whether A is of the type write-before-read (block 334). If the array is write-before-read, the mechanism determines whether any read data output of A appears in the combinational fanin of any write port P (block 336). The mechanism determines whether such a write port P exists (block 338). If not, the mechanism proceeds to block 348 in FIG. 3A to consider the next array A, and operation returns to block 318 to repeat the loop for the next array. If such a P exists in block 338, the mechanism forms a new write port P' by cloning the original logic driving this write port P, though embedding an arbitrary combinational gate in place of the offending read output values (block 340).

Thereafter, or if A is not of type write-before-read in block 334, meaning A is of type read-before-write, the mechanism identifies whether any read port P of A has its data output in the combinational fanin of its enable or address (block 342). The mechanism determines whether such a read port P exists (block 344). If so, the mechanism forms a new enable and address for read port P' by cloning the original logic driving this write port, though embedding an arbitrary combinational gate in place of the offending read output values (block 346). Thereafter, or if no such P exists in block 344, the mechanism proceeds to block 348 of FIG. 3A to consider the next array A, and operation returns to block 318 to repeat the loop for the next array.

If the mechanism has considered the last array in block 348, then the mechanism returns the modified netlist N (block 350). Thereafter, operation ends.

The mechanism described above first attempts to identify sequential dependencies between initial values for registers (blocks 304-316) and arrays (blocks 320-332). If any sequential dependencies are identified, they are broken by replicating the corresponding logic cones and inlining the corresponding initialization logic in place of the corresponding state elements. It is noteworthy that only false dependencies, as discussed above with the Binary Decision Diagram, may arise during the input reparameterization if no true dependencies existed beforehand. In one example embodiment, a preprocessing operation may be applied prior to input reparameterization to check for such inconsistencies, and thereafter blocks 316 and 332 become superfluous. Blocks 334-340 of FIG. 3B rectify any false dependencies that may arise between write inputs and read outputs in an array, for write-before-read arrays for which such a dependency is illegal. As such dependencies are truly false, the mechanism safely rectifies these dependencies by cloning the write port fanin logic and replacing the offending read output dependencies with an arbitrary combinational gate. In an example embodiment, a constant value often serves to enable the greatest reductions. Blocks 342-346 perform a similar transformation to rectify combinational dependencies between read inputs and outputs.

Figure 4:
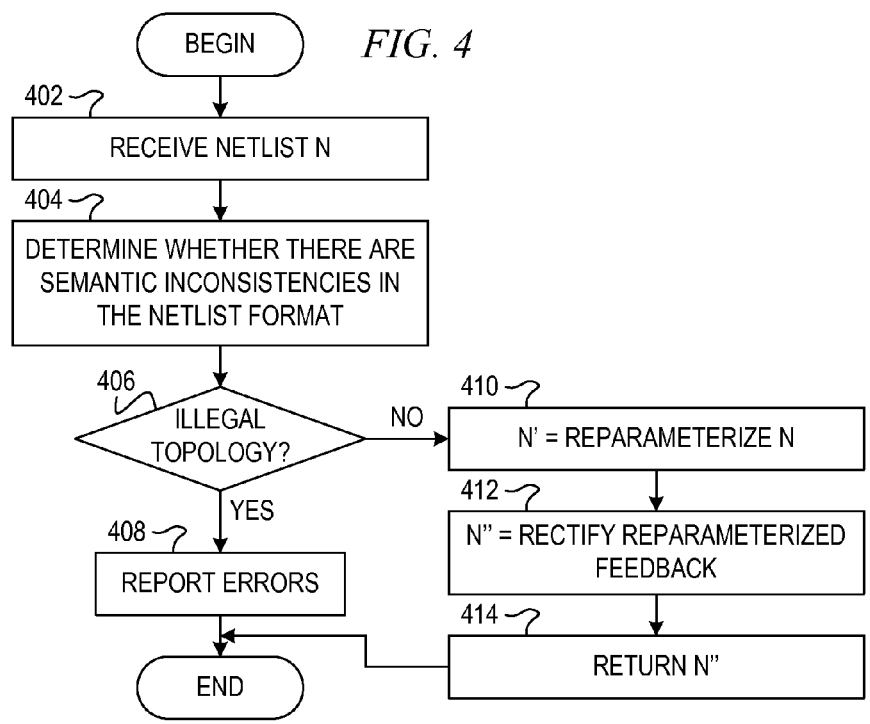
FIG. 4 is a flowchart illustrating operation of a mechanism for top-level input reparameterization and rectification in accordance with an illustrative embodiment.

FIG. 4 is a flowchart illustrating operation of a mechanism for top-level input reparameterization and rectification in accordance with an illustrative embodiment. Operation begins, and the mechanism receives a netlist N (block 402). The mechanism validates that there are no semantic inconsistencies in the netlist format: combinational cycles, cyclic initialization constructs, combinational dependencies between read port outputs and inputs, combinational dependencies between write port inputs and read port outputs for write-before-read arrays (block 404). The mechanism determines whether any such illegal topology is identified (block 406). If any such illegal topology is identified, the mechanism reports such errors (block 408), and operation ends.

If the mechanism does not identify any such illegal topology in block 406, the mechanism performs reparameterization on N to form netlist N' (block 410), as described above with reference to FIG. 2. Then, the mechanism performs false combinational dependency rectification on N' to form netlist N" (block 412), as described above with reference to FIGS. 3A and 3B. Thereafter, the mechanism returns netlist N" (block 414), and operation ends.

In accordance with an illustrative embodiment, a mechanism maps "traces" of behavior obtained over a reparameterized netlist to one consistent with the original netlist. A trace is a sequence of valuations to gates over time. Generally, traces may be "incomplete" in that some valuations may be missing, though nonetheless they may be "adequate" because if simulating such traces over the corresponding netlist and embedding arbitrary valuations to missing RANDOM gate valuations will still illustrate some desired behavior, such as the assertion of a target gate.

Figure 5:
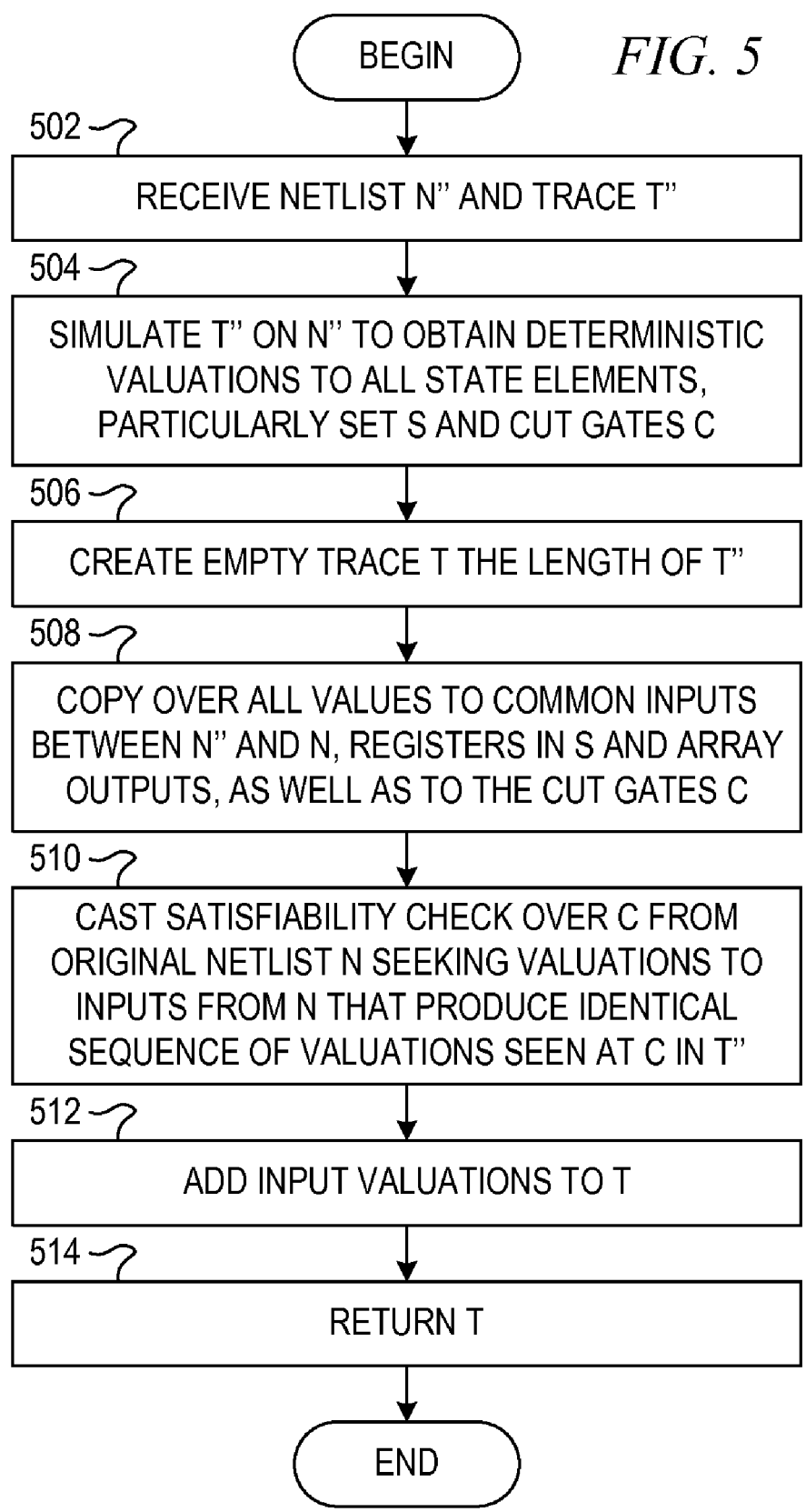
FIG. 5 is a flowchart illustrating operation of a mechanism for reparameterization trace lifting in accordance with an illustrative embodiment.

FIG. 5 is a flowchart illustrating operation of a mechanism for reparameterization trace lifting in accordance with an illustrative embodiment. Operation begins, and the mechanism receives a netlist N" and trace T" (block 502). Let N refer to the original netlist, and N" refer to the netlist formed by the top-level input reparameterization process as described above with reference to FIG. 4. The mechanism simulates T" on N" to obtain deterministic valuations to all state elements (registers and arrayouts), particularly set S from FIG. 2, as well as cut gates C (block 504). The mechanism creates an empty trace T the length of T" (block 506) and copies over all values to common inputs between N" and N, registers in S, and array outputs, as well as to the cut gates C from FIG. 2 (block 508).

The mechanism then casts a satisfiability check over C from original netlist N, seeking valuations to inputs from N (not in N") that produce the identical sequence of valuations as seen at C in T" (block 510). Then, the mechanism adds input valuations obtained from blocks 506 and 508 to trace T (block 512). Thereafter, the mechanism returns trace T (block 514), and operation ends.

Nondeterministic valuations may arise in the presence of arrays regardless of RANDOM gates. Namely, if a read port is disabled or is being read out-of-bounds, or if a nondeterministic initial state is being read, values may be returned that cannot be determined from simulating other logic cones. It is thus critical to obtain valuations to array outputs from T", even if those values are missing, when computing valuations over N during the satisfiability check in block 510. Thus, the mechanism must simulate T" on N" to derive such valuations. Given how the cut is seeded N, simulation will yield a producible sequence of values into T (from blocks 506 and 508) that this satisfiability check of block 510 will yield values in block 512 to complete the desired trace. Note additionally that it is generally desirable to yield incomplete traces with minimal valuations that are nonetheless adequate to, for example, assert a target gate. The mechanism thus avoids copying unnecessary values or simulating T directly. The operation described with reference to FIG. 4 yields a desired minimal-assignment trace T.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
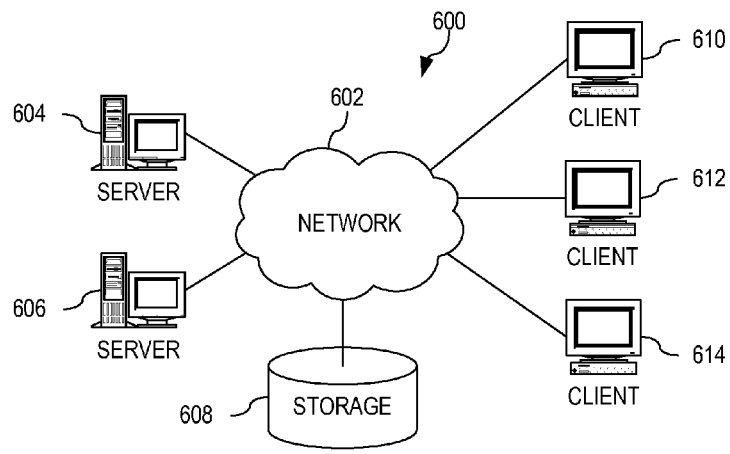
FIG. 6 depicts a pictorial representation of an example distributed data processing system in which aspects of the illustrative embodiments may be implemented.
Figure 7:
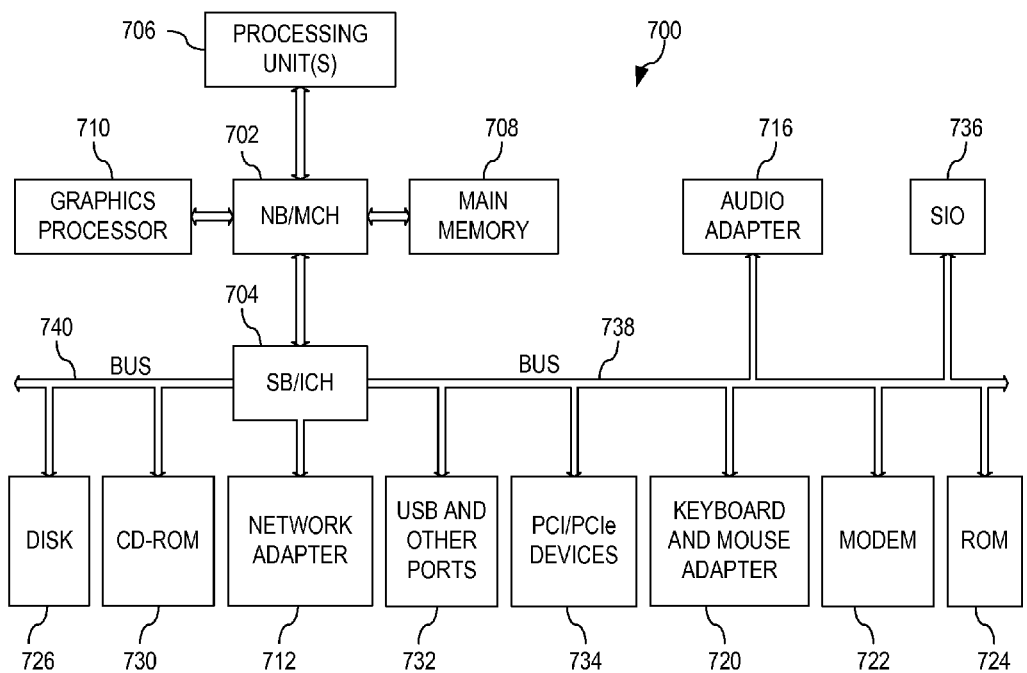
FIG. 7 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 6 and 7 are provided hereafter as example environments in which aspects of the illustrative embodiments may be implemented. While the description following FIGS. 6 and 7 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 6 and 7, example diagrams of data processing environments are provided in which illustrative embodiments of the present invention may be implemented. It should be appreciated that FIGS. 6 and 7 are only examples and are not intended to assert or imply any limitation with regard to the environments in which aspects or embodiments of the present invention may be implemented. Many modifications to the depicted environments may be made without departing from the spirit and scope of the present invention.

FIG. 6 depicts a pictorial representation of an example distributed data processing system in which aspects of the illustrative embodiments may be implemented. Distributed data processing system 600 may include a network of computers in which aspects of the illustrative embodiments may be implemented. The distributed data processing system 600 contains at least one network 602, which is the medium used to provide communication links between various devices and computers connected together within distributed data processing system 600. The network 602 may include connections, such as wire, wireless communication links, or fiber optic cables.

In the depicted example, server 604 and server 606 are connected to network 602 along with storage unit 608. In addition, clients 610, 612, and 614 are also connected to network 602. These clients 610, 612, and 614 may be, for example, personal computers, network computers, or the like. In the depicted example, server 604 provides data, such as boot files, operating system images, and applications to the clients 610, 612, and 614. Clients 610, 612, and 614 are clients to server 604 in the depicted example. Distributed data processing system 600 may include additional servers, clients, and other devices not shown.

In the depicted example, distributed data processing system 600 is the Internet with network 602 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 600 may also be implemented to include a number of different types of networks, such as for example, an intranet, a local area network (LAN), a wide area network (WAN), or the like. As stated above, FIG. 6 is intended as an example, not as an architectural limitation for different embodiments of the present invention, and therefore, the particular elements shown in FIG. 6 should not be considered limiting with regard to the environments in which the illustrative embodiments of the present invention may be implemented.

With reference now to FIG. 7, a block diagram of an example data processing system is shown in which aspects of the illustrative embodiments may be implemented. Data processing system 700 is an example of a computer, such as client 610 in FIG. 6, in which computer usable code or instructions implementing the processes for illustrative embodiments of the present invention may be located.

In the depicted example, data processing system 700 employs a hub architecture including north bridge and memory controller hub (NB/MCH) 702 and south bridge and input/output (I/O) controller hub (SB/ICH) 704. Processing unit 706, main memory 708, and graphics processor 710 are connected to NB/MCH 702. Graphics processor 710 may be connected to NB/MCH 702 through an accelerated graphics port (AGP).

In the depicted example, local area network (LAN) adapter 712 connects to SB/ICH 704. Audio adapter 716, keyboard and mouse adapter 720, modem 722, read only memory (ROM) 724, hard disk drive (HDD) 726, CD-ROM drive 730, universal serial bus (USB) ports and other communication ports 732, and PCI/PCIe devices 734 connect to SB/ICH 704 through bus 738 and bus 740. PCI/PCIe devices may include, for example, Ethernet adapters, add-in cards, and PC cards for notebook computers. PCI uses a card bus controller, while PCIe does not. ROM 724 may be, for example, a flash basic input/output system (BIOS).

HDD 726 and CD-ROM drive 730 connect to SB/ICH 704 through bus 740. HDD 726 and CD-ROM drive 730 may use, for example, an integrated drive electronics (IDE) or serial advanced technology attachment (SATA) interface. Super I/O (SIO) device 736 may be connected to SB/ICH 704.

An operating system runs on processing unit 706. The operating system coordinates and provides control of various components within the data processing system 700 in FIG. 7. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 700 (Java is a trademark of Sun Microsystems, Inc. in the United States, other countries, or both).

As a server, data processing system 700 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 700 may be a symmetric multiprocessor (SMP) system including a plurality of processors in processing unit 706. Alternatively, a single processor system may be employed.

Instructions for the operating system, the object-oriented programming system, and applications or programs are located on storage devices, such as HDD 726, and may be loaded into main memory 708 for execution by processing unit 706. The processes for illustrative embodiments of the present invention may be performed by processing unit 706 using computer usable program code, which may be located in a memory such as, for example, main memory 708, ROM 724, or in one or more peripheral devices 726 and 730, for example.

A bus system, such as bus 738 or bus 740 as shown in FIG. 7, may be comprised of one or more buses. Of course, the bus system may be implemented using any type of communication fabric or architecture that provides for a transfer of data between different components or devices attached to the fabric or architecture. A communication unit, such as modem 722 or network adapter 712 of FIG. 7, may include one or more devices used to transmit and receive data. A memory may be, for example, main memory 708, ROM 724, or a cache such as found in NB/MCH 702 in FIG. 7.

Those of ordinary skill in the art will appreciate that the hardware in FIGS. 6 and 7 may vary depending on the implementation. Other internal hardware or peripheral devices, such as flash memory, equivalent non-volatile memory, or optical disk drives and the like, may be used in addition to or in place of the hardware depicted in FIGS. 6 and 7. Also, the processes of the illustrative embodiments may be applied to a multiprocessor data processing system, other than the SMP system mentioned previously, without departing from the spirit and scope of the present invention.

Moreover, the data processing system 700 may take the form of any of a number of different data processing systems including client computing devices, server computing devices, a tablet computer, laptop computer, telephone or other communication device, a personal digital assistant (PDA), or the like. In some illustrative examples, data processing system 700 may be a portable computing device which is configured with flash memory to provide non-volatile memory for storing operating system files and/or user-generated data, for example. Essentially, data processing system 700 may be any known or later developed data processing system without architectural limitation.

Thus, the illustrative embodiments provide a mechanism for increasing the scalability of transformation-based formal verification solutions through enabling the use of input reparameterization on logic models that include memory arrays. A post-processing mechanism prevents input reparameterization from creating topologically inconsistent models in the presence of arrays. Additionally, this technique may be used to rectify inconsistent topologies that may arise when reparameterizing even netlists without arrays, namely false sequential dependencies across initialization constructs. Furthermore, the illustrative embodiments provide a mechanism to undo the effects of memory array based input reparameterization on verification results.

These mechanisms constitute a critical step in advancing the capacity of formal verification tools. Additionally, formal reasoning techniques are often essential to automated logic synthesis flows. For example, redundancy removal and related logic simplification techniques require formal reasoning to identify optimization potential and to justify the validity of a desired reduction. Furthermore, it is essential that an equivalence checker be able to verify the equivalence of pre- and post-synthesis models. The proposed solution offers fundamental capacity boosts both to synthesis and equivalence checking, collectively enabling larger-block synthesis with greater automation and optimality potential than historically possible. Finally, the technique of input reparameterization holds substantial promise in the emerging field of software synthesis/verification, as such models often comprise a very large set of inputs, i.e. nondeterministic data input. Such models often additionally require the ability to represent native memory arrays, e.g., main memory. This mechanism holds substantial promise to enable dramatic capacity boosts for software analysis.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing input reparameterization on an integrated circuit design with a memory array, the method comprising:
   receiving, by the data processing system, an original netlist for an integrated circuit design, wherein the netlist comprises a memory array;
   validating, by the data processing system, that there are no semantic inconsistencies in the original netlist;
   performing, by the data processing system, input reparameterization on the original netlist to form a reparameterized netlist;
   performing, by the data processing system, false combinational dependency rectification on the reparameterized netlist to form a rectified netlist; and
   outputting, by the data processing system, the rectified netlist.

2. The method of claim 1, wherein performing input reparameterization on the original netlist comprises:
   identifying a set of random gates in the original netlist;
   identifying a set of gates that define inputs to state elements in the original netlist;
   identifying a cut between the set of random gates and the set of gates that define inputs to state elements in the original netlist;
   identifying a set of register and array read data outputs that fan out to the cut;
   determining a set of valuations producible to the cut;
   synthesizing replacement logic for a source side of the cut that produces the set of valuations producible to the cut; and
   replacing the source side of the cut with the synthesized replacement logic.

3. The method of claim 2, wherein the set of gates that define inputs to the state elements comprises register initial value gates, next-state function gates, and array enable pins, address pins, and data pins for initialization and write ports.

4. The method of claim 2, wherein determining a set of valuations producible to the cut comprises performing exhaustive logic simulation enumerating behavior of a cut between the set of random gates and the set of gates that define inputs to state elements in the original netlist over the set of random gates and the set of register and array read data outputs that fan out to the cut.

5. The method of claim 2, wherein determining a set of valuations producible to the cut comprises performing a Boolean satisfiability technique to symbolically enumerate behavior of a cut between the set of random gates and the set of gates that define inputs to state elements in the original netlist over the set of random gates and the set of register and array read data outputs that fan out to the cut.

6. The method of claim 2, wherein determining a set of valuations producible to the cut comprises using Binary Decision Diagrams to compute a function of each element of the cut between the set of random gates and the set of gates that define inputs to state elements in the original netlist over the set of random gates in the netlist and the set of register and array read data outputs that fan out to the cut, create a parametric variable for each element of the cut between the set of random gates and the set of gates that define inputs to state elements in the original netlist, and compute a conjunction over all element of the cut between the set of random gates and the set of gates that define inputs to state elements in the original netlist meeting the function of each element of the cut between the set of random gates and the set of gates that define inputs to state elements in the original netlist over the set of random gates in the original netlist and the set of register and array read data outputs that fan out to the cut.

7. The method of claim 2, further comprising:
   simulating the rectified netlist to form a rectified trace;
   simulating the rectified trace on the rectified netlist to obtain deterministic valuations to all state elements in the rectified netlist;
   creating an empty trace;
   copying over all values to common inputs between the rectified netlist and the original netlist, registers in the set of gates that define inputs to state elements in the original netlist, array outputs, and gates in the cut between the set of random gates and the set of gates that define inputs to state elements in the original netlist;
   casting a satisfiability check over the cut between the set of random gates and the set of gates that define inputs to state elements in the original netlist to inputs from the original netlist that produce an identical sequence of valuations seen at the cut between the set of random gates and the set of gates that define inputs to state elements in the rectified netlist in the rectified trace; and
   adding input valuations to the empty trace.

8. The method of claim 1, wherein performing false combinational dependency rectification on the reparameterized netlist comprises:
   rectifying sequential dependencies between initial values for registers and arrays;
   rectifying false dependencies between write inputs and read outputs for write-before-read arrays; and
   rectifying combinational dependencies between read inputs and outputs.

9. The method of claim 8, wherein rectifying sequential dependencies between initial values for registers and arrays comprises replacing corresponding logic cones and inlining corresponding initialization logic in place of corresponding state elements.

10. The method of claim 8, wherein rectifying false dependencies between write inputs and read outputs for write-before-read arrays comprises cloning write port fanin logic and replacing offending read output dependencies with an arbitrary combinational gate.

11. The method of claim 8, wherein rectifying combinational dependencies between read inputs and outputs comprises cloning logic driving the read inputs and replacing offending read output dependencies with an arbitrary combinational gate.

12. A computer program product comprising a computer readable storage medium having a computer readable program stored therein, wherein the computer readable program, when executed on a computing device, causes the computing device to:
   receive, by the computing device, an original netlist for an integrated circuit design, wherein the netlist comprises a memory array;
   validate, by the computing device, that there are no semantic inconsistencies in the original netlist;

perform, by the computing device, input reparameterization on the original netlist to form a reparameterized netlist;

perform, by the computing device, false combinational dependency rectification on the reparameterized netlist to form a rectified netlist; and output, by the computing device, the rectified netlist.

13. The computer program product of claim 12, wherein performing input reparameterization on the original netlist comprises:

identifying a set of random gates in the original netlist;

identifying a set of gates that define inputs to state elements in the original netlist;

identifying a cut between the set of random gates and the set of gates that define inputs to state elements in the original netlist;

identifying a set of register and array read data outputs that fan out to the cut;

determining a set of valuations producible to the cut;

synthesizing replacement logic for a source side of the cut that produces the set of valuations producible to the cut; and replacing the source side of the cut with the synthesized replacement logic.

14. The computer program product of claim 13, wherein the computer readable program further causes the computing device to:

simulate the rectified netlist to form a rectified trace;

simulate the rectified trace on the rectified netlist to obtain deterministic valuations to all state elements in the rectified netlist;

create an empty trace;

copy over all values to common inputs between the rectified netlist and the original netlist, registers in the set of gates that define inputs to state elements in the original netlist, array outputs, and gates in the cut between the set of random gates and the set of gates that define inputs to state elements in the original netlist;

cast a satisfiability check over the cut between the set of random gates and the set of gates that define inputs to state elements in the original netlist to inputs from the original netlist that produce an identical sequence of valuations seen at the cut between the set of random gates and the set of gates that define inputs to state elements in the rectified netlist in the rectified trace; and add input valuations to the empty trace.

15. The computer program product of claim 12, wherein performing false combinational dependency rectification on the reparameterized netlist comprises:

rectifying sequential dependencies between initial values for registers and arrays;

rectifying false dependencies between write inputs and read outputs for write-before-read arrays; and rectifying combinational dependencies between read inputs and outputs.

16. The computer program product of claim 12, wherein the computer readable program is stored in a computer readable storage medium in a data processing system and wherein the computer readable program was downloaded over a network from a remote data processing system.

17. The computer program product of claim 12, wherein the computer readable program is stored in a computer readable storage medium in a server data processing system and wherein the computer readable program is downloaded over a network to a remote data processing system for use in a computer readable storage medium with the remote system.

18. An apparatus, comprising:

a processor; and a memory coupled to the processor, wherein the memory comprises instructions which, when executed by the processor, cause the processor to:

receive an original netlist for an integrated circuit design, wherein the netlist comprises a memory array;

validate that there are no semantic inconsistencies in the original netlist;

perform input reparameterization on the original netlist to form a reparameterized netlist;

perform false combinational dependency rectification on the reparameterized netlist to form a rectified netlist; and output the rectified netlist.

19. The apparatus of claim 18, wherein performing input reparameterization on the original netlist comprises:

identifying a set of random gates in the original netlist;

identifying a set of gates that define inputs to state elements in the original netlist;

identifying a cut between the set of random gates and the set of gates that define inputs to state elements in the original netlist;

identifying a set of register and array read data outputs that fan out to the cut;

determining a set of valuations producible to the cut;

synthesizing replacement logic for a source side of the cut that produces the set of valuations producible to the cut; and replacing the source side of the cut with the synthesized replacement logic.

20. The apparatus of claim 18, wherein performing false combinational dependency rectification on the reparameterized netlist comprises:

rectifying sequential dependencies between initial values for registers and arrays;

rectifying false dependencies between write inputs and read outputs for write-before-read arrays; and rectifying combinational dependencies between read inputs and outputs.

* * * * *